(12) United States Patent
Flemming et al.

(10) Patent No.: US 11,908,617 B2
(45) Date of Patent: Feb. 20, 2024

(54) BROADBAND INDUCTION

(71) Applicant: 3D Glass Solutions, Inc., Albuquerque, NM (US)

(72) Inventors: Jeb H. Flemming, Albuquerque, NM (US); Reddy R. Vangala, Albuquerque, NM (US)

(73) Assignee: 3D GLASS SOLUTIONS, INC., Albuquerque, NM (US)

( * ) Notice: Subject to any disclaimer, the term of this patent is extended or adjusted under 35 U.S.C. 154(b) by 0 days.

(21) Appl. No.: 17/917,877

(22) PCT Filed: Apr. 15, 2021

(86) PCT No.: PCT/US2021/027499
§ 371 (c)(1),
(2) Date: Oct. 7, 2022

(87) PCT Pub. No.: WO2021/211855
PCT Pub. Date: Oct. 21, 2021

(65) Prior Publication Data
US 2023/0122085 A1 Apr. 20, 2023
US 2023/0352238 A9 Nov. 2, 2023

Related U.S. Application Data

(60) Provisional application No. 63/011,505, filed on Apr. 17, 2020.

(51) Int. Cl.
| | |
|---|---|
| *H01F 41/04* | (2006.01) |
| *H03H 7/01* | (2006.01) |
| *C03C 15/00* | (2006.01) |
| *C03C 23/00* | (2006.01) |
| *H01F 17/00* | (2006.01) |
| *H03H 7/06* | (2006.01) |

(52) U.S. Cl.
CPC ........... *H01F 41/041* (2013.01); *C03C 15/00* (2013.01); *C03C 23/007* (2013.01); *H01F 17/0033* (2013.01); *H03H 7/0153* (2013.01); *H03H 7/06* (2013.01); *H03H 7/1758* (2013.01); *H01F 2017/0073* (2013.01)

(58) Field of Classification Search
CPC .......................... H01F 41/041; H03H 7/0153
USPC .......................................... 333/185; 336/223
See application file for complete search history.

(56) References Cited

U.S. PATENT DOCUMENTS

| | | |
|---|---|---|
| 2,515,937 A | 12/1943 | Stookey |
| 2,515,943 A | 1/1949 | Stookey |

(Continued)

FOREIGN PATENT DOCUMENTS

| | | |
|---|---|---|
| CN | 1562831 | 4/2004 |
| CN | 105047558 | 11/2015 |

(Continued)

OTHER PUBLICATIONS

European Search Report and Supplemental European Search Report for EP 19905255.6 dated Aug. 4, 2022, 8 pp.

(Continued)

*Primary Examiner* — Rakesh B Patel
(74) *Attorney, Agent, or Firm* — Edwin S. Flores; Daniel J. Chalker; Chalker Flores, LLP

(57) ABSTRACT

The present invention includes a method of a low cost, reliable novel broadband inductor that can be used with a capacitor to form a broadband filter.

27 Claims, 3 Drawing Sheets

(56) References Cited

U.S. PATENT DOCUMENTS

| | | |
|---|---|---|
| 2,515,940 A | 7/1950 | Stookey |
| 2,515,941 A | 7/1950 | Stookey |
| 2,628,160 A | 2/1953 | Stookey |
| 2,684,911 A | 7/1954 | Stookey |
| 2,971,853 A | 2/1961 | Stookey |
| 3,281,264 A | 10/1966 | Cape et al. |
| 3,292,115 A | 12/1966 | La Rosa |
| 3,904,991 A | 9/1975 | Ishli et al. |
| 3,985,531 A | 10/1976 | Grossman |
| 3,993,401 A | 11/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,444,616 A | 4/1984 | Fujita et al. |
| 4,514,053 A | 4/1985 | Borrelli et al. |
| 4,537,612 A | 8/1985 | Borrelli et al. |
| 4,611,882 A | 9/1986 | Susumu |
| 4,647,940 A | 3/1987 | Traut et al. |
| 4,692,015 A | 9/1987 | Loce et al. |
| 4,788,165 A | 11/1988 | Fong et al. |
| 4,942,076 A | 7/1990 | Panicker et al. |
| 5,078,771 A | 1/1992 | Wu |
| 5,147,740 A | 9/1992 | Robinson |
| 5,212,120 A | 5/1993 | Araujo et al. |
| 5,215,610 A | 6/1993 | Dipaolo et al. |
| 5,312,674 A | 5/1994 | Heartling et al. |
| 5,352,996 A | 10/1994 | Kawaguchi |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A | 5/1999 | Tsukamoto et al. |
| 5,919,607 A | 7/1999 | Lawandy et al. |
| 5,998,224 A | 12/1999 | Rohr et al. |
| 6,046,641 A | 4/2000 | Chawla et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,417,754 B1 | 7/2002 | Bernhardt et al. |
| 6,383,566 B1 | 11/2002 | Pfost et al. |
| 6,485,690 B1 | 12/2002 | Mei |
| 6,511,793 B1 | 1/2003 | Cho et al. |
| 6,514,375 B2 | 2/2003 | Kijima |
| 6,562,523 B1 | 2/2003 | Wu et al. |
| 6,678,453 B2 | 1/2004 | Bellman et al. |
| 6,689,824 B2 | 2/2004 | Yamamoto et al. |
| 6,771,860 B2 | 8/2004 | Trezza et al. |
| 6,783,920 B2 | 8/2004 | Livingston et al. |
| 6,824,974 B2 | 11/2004 | Pisharody et al. |
| 6,830,221 B1 | 12/2004 | Janson et al. |
| 6,843,902 B1 | 1/2005 | Penner et al. |
| 6,875,544 B1 | 4/2005 | Sweatt et al. |
| 6,932,933 B2 | 8/2005 | Helvajian et al. |
| 6,977,722 B2 | 12/2005 | Wohlstadter et al. |
| 7,033,821 B2 | 4/2006 | Kim et al. |
| 7,064,045 B2 | 6/2006 | Yang |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 10/2009 | Farnsworth et al. |
| 7,915,076 B2 | 3/2011 | Ogawa et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 | 4/2014 | Flemming et al. |
| 9,385,083 B1 | 9/2016 | Herrault et al. |
| 9,449,753 B2 | 9/2016 | Kim |
| 9,635,757 B1 | 4/2017 | Chen et al. |
| 9,755,305 B2 | 9/2017 | Desclos et al. |
| 9,819,991 B1 | 11/2017 | Rajagopalan et al. |
| 9,843,083 B2 | 12/2017 | Cooper et al. |
| 10,070,533 B2 | 9/2018 | Flemming et al. |
| 10,201,901 B2 | 2/2019 | Flemming et al. |
| 10,655,377 B2 | 5/2020 | Flemming et al. |
| 10,854,946 B2 | 12/2020 | Flemming et al. |
| 10,903,545 B2 | 1/2021 | Flemming et al. |
| 11,101,532 B2 | 8/2021 | Flemming et al. |
| 11,139,582 B2 | 10/2021 | Flemming et al. |
| 11,161,773 B2 | 11/2021 | Flemming et al. |
| 11,264,167 B2 | 3/2022 | Flemming et al. |
| 11,270,843 B2 | 3/2022 | Flemming et al. |
| 11,342,896 B2 | 5/2022 | Flemming et al. |
| 11,367,939 B2 | 6/2022 | Flemming et al. |
| 11,373,908 B2 | 6/2022 | Flemming et al. |
| 11,524,807 B2 | 12/2022 | Gentili et al. |
| 2001/0051584 A1 | 12/2001 | Harada et al. |
| 2002/0015546 A1 | 2/2002 | Bhagavatula |
| 2002/0086246 A1 | 7/2002 | Lee |
| 2002/0100608 A1 | 8/2002 | Fushie et al. |
| 2003/0025227 A1 | 2/2003 | Daniell |
| 2003/0107459 A1 | 6/2003 | Takahashi et al. |
| 2003/0124716 A1 | 7/2003 | Hess et al. |
| 2003/0135201 A1 | 7/2003 | Gonnelli |
| 2003/0143802 A1 | 7/2003 | Chen et al. |
| 2003/0156819 A1 | 8/2003 | Pruss et al. |
| 2003/0174944 A1 | 9/2003 | Dannoux |
| 2003/0228682 A1 | 12/2003 | Lakowicz et al. |
| 2003/0231076 A1 | 12/2003 | Takeuchi et al. |
| 2003/0231830 A1 | 12/2003 | Hikichi |
| 2004/0008391 A1 | 1/2004 | Bowley et al. |
| 2004/0020690 A1 | 2/2004 | Parker et al. |
| 2004/0058504 A1 | 3/2004 | Kellar et al. |
| 2004/0104449 A1 | 6/2004 | Yoon |
| 2004/0155748 A1 | 8/2004 | Steingroever |
| 2004/0171076 A1 | 9/2004 | Dejneka et al. |
| 2004/0184705 A1 | 9/2004 | Shimada et al. |
| 2004/0198582 A1 | 10/2004 | Borrelli et al. |
| 2004/0227596 A1 | 11/2004 | Nguyen et al. |
| 2005/0089901 A1 | 4/2005 | Porter et al. |
| 2005/0105860 A1 | 5/2005 | Oono |
| 2005/0111162 A1 | 5/2005 | Osaka et al. |
| 2005/0118779 A1 | 6/2005 | Ahn |
| 2005/0150683 A1 | 7/2005 | Farnworth et al. |
| 2005/0170670 A1 | 8/2005 | King et al. |
| 2005/0194628 A1 | 9/2005 | Kellar et al. |
| 2005/0212432 A1 | 9/2005 | Neil et al. |
| 2005/0277550 A1 | 12/2005 | Brown et al. |
| 2006/0092079 A1 | 5/2006 | Rochemont |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Dubrow et al. |
| 2006/0171033 A1 | 8/2006 | Shreder et al. |
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0201201 A1 | 9/2006 | Fushie et al. |
| 2006/0283948 A1 | 12/2006 | Naito |
| 2007/0023386 A1 | 2/2007 | Kravitz et al. |
| 2007/0034910 A1 | 2/2007 | Shie |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0254490 A1 | 11/2007 | Jain |
| 2007/0267708 A1 | 11/2007 | Courcimault |

(56) References Cited

U.S. PATENT DOCUMENTS

| | | |
|---|---|---|
| 2007/0272829 A1 | 11/2007 | Nakagawa et al. |
| 2007/0279837 A1 | 12/2007 | Chow et al. |
| 2007/0296520 A1 | 12/2007 | Hosokawa et al. |
| 2008/0042785 A1* | 2/2008 | Yagisawa ............ H01P 1/2007 333/245 |
| 2008/0079565 A1 | 4/2008 | Koyama |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamura |
| 2008/0231402 A1 | 9/2008 | Jow et al. |
| 2008/0291442 A1 | 11/2008 | Lawandy |
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0200540 A1 | 8/2009 | Bjoerk et al. |
| 2009/0243783 A1 | 10/2009 | Fouquet et al. |
| 2009/0290281 A1 | 11/2009 | Nagamoto et al. |
| 2010/0009838 A1 | 1/2010 | Muraki |
| 2010/0022416 A1 | 1/2010 | Flemming et al. |
| 2010/0044089 A1 | 2/2010 | Shibuya et al. |
| 2010/0059265 A1 | 3/2010 | Kim |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0084371 A1 | 4/2011 | Rotay et al. |
| 2011/0086606 A1 | 4/2011 | Chen et al. |
| 2011/0108525 A1 | 5/2011 | Chien et al. |
| 2011/0114496 A1 | 5/2011 | Dopp et al. |
| 2011/0115051 A1 | 5/2011 | Kim et al. |
| 2011/0170273 A1 | 7/2011 | Helvajian |
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0001770 A1 | 1/2013 | Liu |
| 2013/0015467 A1 | 1/2013 | Krumbein et al. |
| 2013/0015578 A1 | 1/2013 | Thacker et al. |
| 2013/0105941 A1 | 5/2013 | Vanslette et al. |
| 2013/0119401 A1 | 5/2013 | D'evelyn et al. |
| 2013/0142998 A1 | 6/2013 | Flemming et al. |
| 2013/0143381 A1 | 6/2013 | Kikukawa |
| 2013/0183805 A1 | 7/2013 | Wong et al. |
| 2013/0207745 A1 | 8/2013 | Yun et al. |
| 2013/0209026 A1 | 8/2013 | Doany et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0104288 A1 | 4/2014 | Shenoy et al. |
| 2014/0144681 A1 | 5/2014 | Pushparaj et al. |
| 2014/0145326 A1 | 5/2014 | Lin et al. |
| 2014/0169746 A1 | 6/2014 | Hung et al. |
| 2014/0203891 A1 | 7/2014 | Yazaki |
| 2014/0247269 A1 | 9/2014 | Berdy et al. |
| 2014/0272688 A1 | 9/2014 | Dillion |
| 2014/0367695 A1 | 12/2014 | Barlow |
| 2015/0035638 A1 | 2/2015 | Stephanou et al. |
| 2015/0048901 A1 | 2/2015 | Rogers |
| 2015/0071593 A1 | 3/2015 | Kanke |
| 2015/0210074 A1 | 7/2015 | Chen et al. |
| 2015/0228712 A1 | 8/2015 | Yun |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0152505 A1 | 6/2016 | Fushie |
| 2016/0181211 A1 | 6/2016 | Kamgaing et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0213762 A1 | 7/2017 | Gouk |
| 2017/0370870 A1 | 12/2017 | Fomina et al. |
| 2018/0310399 A1 | 10/2018 | Nair et al. |
| 2018/0323485 A1 | 11/2018 | Gnanou et al. |
| 2019/0093233 A1 | 3/2019 | Flemming et al. |
| 2019/0177213 A1 | 6/2019 | Flemming et al. |
| 2019/0280079 A1 | 7/2019 | Bouvier et al. |
| 2020/0060513 A1 | 2/2020 | Ito et al. |
| 2020/0066443 A1 | 2/2020 | Lu et al. |
| 2020/0119255 A1 | 4/2020 | Then et al. |
| 2020/0168536 A1 | 5/2020 | Link et al. |
| 2020/0211985 A1 | 7/2020 | Pietambaram et al. |
| 2020/0227470 A1 | 7/2020 | Then et al. |
| 2020/0235020 A1 | 7/2020 | Boek |
| 2020/0243248 A1 | 7/2020 | Flemming et al. |
| 2020/0252074 A1 | 8/2020 | Healy et al. |
| 2020/0275558 A1 | 8/2020 | Fujita |
| 2020/0382086 A1 | 12/2020 | Flemming et al. |
| 2020/0383209 A1 | 12/2020 | Flemming et al. |
| 2021/0013303 A1 | 1/2021 | Chen et al. |
| 2021/0175136 A1 | 6/2021 | Flemming et al. |
| 2021/0271275 A1* | 9/2021 | Kim .................... H01F 27/2804 |
| 2022/0173488 A1 | 6/2022 | Flemming et al. |

FOREIGN PATENT DOCUMENTS

| | | |
|---|---|---|
| CN | 105938928 | 9/2016 |
| CN | 210668058 | 6/2020 |
| DE | 102004059252 | 1/2006 |
| EP | 0311274 | 12/1989 |
| EP | 0507719 | 10/1992 |
| EP | 0685857 | 12/1995 |
| EP | 0949648 | 10/1999 |
| EP | 1487019 | 12/2004 |
| EP | 1683571 | 6/2006 |
| GB | 619779 A | 3/1949 |
| GB | 1407151 | 9/1975 |
| JP | 56-155587 | 12/1981 |
| JP | 61149905 | 7/1986 |
| JP | 61231529 | 10/1986 |
| JP | 62202840 | 9/1987 |
| JP | 63-128699 | 6/1988 |
| JP | H393683 | 4/1991 |
| JP | 05139787 | 6/1993 |
| JP | 08179155 | 12/1994 |
| JP | 0826767 | 1/1996 |
| JP | 10007435 | 1/1998 |
| JP | 1998199728 | 7/1998 |
| JP | 1999344648 | 12/1999 |
| JP | 2000114818 A | 4/2000 |
| JP | 2000228615 | 8/2000 |
| JP | 2001033664 | 2/2001 |
| JP | 2001284533 A | 10/2001 |
| JP | 2005302987 | 10/2005 |
| JP | 2005215644 | 11/2005 |
| JP | 2006032982 | 2/2006 |
| JP | 2006179564 | 6/2006 |
| JP | 2006324489 A | 11/2006 |
| JP | 2008252797 | 10/2008 |
| JP | 2011192836 | 9/2011 |
| JP | 2012079960 | 4/2012 |
| JP | 2013062473 | 4/2013 |
| JP | 2013217989 | 10/2013 |
| JP | 2014241365 | 12/2014 |
| JP | 2015028651 | 2/2015 |
| JP | H08026767 | 1/2016 |

(56) References Cited

FOREIGN PATENT DOCUMENTS

| | | |
|---|---|---|
| JP | 2018200912 | 12/2018 |
| JP | 2021145131 | 9/2021 |
| KR | 1020040001906 B1 | 1/2004 |
| KR | 1020050000923 | 1/2005 |
| KR | 20060092643 A | 8/2006 |
| KR | 100941691 | 2/2010 |
| KR | 101167691 | 7/2012 |
| KR | 101519760 | 5/2015 |
| WO | 2005027606 A1 | 3/2005 |
| WO | 2007088058 | 8/2007 |
| WO | 2008119080 | 10/2008 |
| WO | 2008154931 | 12/2008 |
| WO | 2009062011 | 5/2009 |
| WO | 2011109648 | 9/2011 |
| WO | 2012078213 | 6/2012 |
| WO | 2014062226 | 4/2014 |
| WO | 2014062311 | 4/2014 |
| WO | 2014193525 A1 | 12/2014 |
| WO | 2015108648 | 7/2015 |
| WO | 2018209422 A1 | 11/2018 |

OTHER PUBLICATIONS

European Search Report and Supplemental European Search Report for EP 20783596.8 dated Oct. 26, 2022, 13 pp.
European Search Report and Supplemental European Search Report for EP 20877664.1 dated Oct. 28, 2022, 10 pp.
Flemming, J.H., et al., "Cost Effective 3D Glass Microfabrication for Advanced RF Packages," Microwave Journal, Apr. 14, 2014, 12 pp.
Foster, T., "High-Q RF Devices in APEX Glass," Jun. 21, 2018, https://nanopdf.com/download/high-q-rf-devices-in-apex-glass_pdf, retrieved on Oct. 3, 2022, 8 pp.
International Search Report and Written Opinion for PCT/US2022/31993 dated Sep. 9, 2022 by the USPTO, 9 pp.
International Search Report and Written Opinion for PCT/US2022/29442 dated Oct. 6, 2022 by the USPTO, 20 pp.
International Search Report and Written Opinion for PCT/US2022/42516 dated Feb. 3, 2023 by the USPTO, 22 pp.
International Search Report and Written Opinion for PCT/US2023/010118 dated Apr. 5, 2023 by the USPTO, 12 pp.
Aslan, et al, "Metal-Enhanced Fluorescence: an emerging tool in biotechnology" Current opinion in Biotechnology (2005), 16:55-62.
Azad, I., et al., "Design and Performance Analysis of 2.45 GHz Microwave Bandpass Filter with Reduced Harmonics," International Journal of Engineering Research and Development (2013), 5(11):57-67.
Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.
Beke, S., et al., "Fabrication of Transparent and Conductive Microdevices," Journal of Laser Micro/Nanoengineering (2012), 7(1):28-32.
Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.
Cheng, et al. "Three-dimensional Femtosecond Laser Integration in Glasses" The Review of Laser Engineering, vol. 36, 2008, pp. 1206-1209, Section 2, Subsection 3.1.
Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.
Chowdhury, et al, "Metal-Enhanced Chemiluminescence", J Fluorescence (2006), 16:295-299.
Crawford, Gregory P., "Flexible Flat Panel Display Technology," John Wiley and Sons, NY, (2005), 9 pages.

Dang, et al. "Integrated thermal-fluidic I/O interconnects for an on-chip microchannel heat sink," IEEE Electron Device Letters, vol. 27, No. 2, pp. 117-119, 2006.
Dietrich, T.R., et al., "Fabrication Technologies for Microsystems Utilizing Photoetchable Glass," Microelectronic Engineering 30, (1996), pp. 407-504.
European Search Report and Supplemental European Search Report for 15741032.5 dated Aug. 4, 2017, 11 pp.
European Search Report and Supplemental European Search Report for 15789595.4 dated Mar. 31, 2017, 7 pp.
European Search Report and Supplemental European Search Report for 17744848.7 dated Oct. 30, 2019, 9 pp.
European Search Report and Supplemental European Search Report for 17757365.6 dated Oct. 14, 2019, 14 pp.
European Search Report and Supplemental European Search Report for EP 18828907.8 dated Mar. 25, 2020, 11 pp.
European Search Report and Supplemental European Search Report for EP 18889385.3 dated Dec. 2, 2020, 8 pp.
European Search Report and Supplemental European Search Report for EP 18898912.3 dated Feb. 2, 2021, 10 pp.
European Search Report and Supplemental European Search Report for EP 19784673.6 dated Feb. 2, 2021, 8 pp.
European Search Report and Supplemental European Search Report for EP 19811031.4 dated Feb. 26, 2021, 7 pp.
European Search Report and Supplemental European Search Report for EP 19861556.9 dated Jan. 18, 2022, 9 pp.
European Search Report and Supplemental European Search Report for EP 19905255.6 dated Jul. 26, 2022, 8 pp.
European Search Report and Supplemental European Search Report for EP 19906040.1 dated Feb. 4, 2022, 16 pp.
European Search Report and Supplemental European Search Report for EP 20792242.8 dated May 3, 2022, 10 pp.
Geddes, et al, "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.
Grine, F. et al., "High-Q Substrate Integrated Waveguide Resonator Filter With Dielectric Loading," IEEE Access vol. 5, Jul. 12, 2017, pp. 12526-12532.
Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
International Search Report and Written Opinion for PCT/US2017/026662 dated Jun. 5, 2017, 11 pp.
International Search Report and Written Opinion for PCT/US2018/029559 dated Aug. 3, 2018, 9 pp.

(56) References Cited

OTHER PUBLICATIONS

International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/034245 dated Aug. 9, 2019 by Australian Patent Office, 10 pp.
International Search Report and Written Opinion for PCT/US2019/050644 dated Dec. 4, 2019 by USPTO, 9 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
International Search Report and Written Opinion for PCT/US2020/026673 dated Jun. 22, 2020, by the USPTO, 13 pp.
International Search Report and Written Opinion for PCT/US2020/028474 dated Jul. 17, 2020 by the USPTO, 7 pp.
International Search Report and Written Opinion for PCT/US2020/054394 dated Jan. 7, 2021 by the USPTO, 15 pp.
International Search Report and Written Opinion for PCT/US2021/021371 dated May 20, 2021 by the USPTO, 10 pp.
International Search Report and Written Opinion for PCT/US2021/027499 dated Jun. 16, 2021 by the USPTO, 7 pp.
International Technology Roadmap for Semiconductors, 2007 Edition, "Assembly and Packaging," 9 pages.
Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Kim, Dongsu, et al., "A Compact and Low-profile GaN Power Amplifier Using Interposer-based MMCI Technology," 2014 IEEE 16th Electronics Packaging Technology Conference, pp. 672-675.
Lakowicz, et al; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-75.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Mohamedelhassan, A., "Fabrication of Ridge Waveguides in Lithium Niobate," Independent thesis Advanced level, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.
Optics 101, "What is a Halogen Lamp?", Arpil 25, 2014, p. 1-2.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG. Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
TechNote #205, Bangs Laboratories, www.bangslabs.com/technotes/205.pdf, "Covalent Coupling".
Topper, et al., "Development of a high density glass interposer based on wafer level packaging technologies," 2014 IEEE 64th Electronic Components and Technology Conference, May 27, 2014, pp. 1498-1503.
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
Supplementary European Search Repor for EP 21768296.2 dated May 5, 2023, 10 pp.
European Search Report and Supplemental European Search Report for EP 21787618.4 dated Jul. 28, 2023, 10 pp.
International Search Report and Written Opinion for PCT/US2023/064364 dated Sep. 27, 2023, by USPTO 11 ps.
International Search Report and Written Opinion for PCT/US2023/17311 dated Aug. 14, 2023 by the USPTO, 16 pp.

\* cited by examiner

BROADBAND INDUCTION

CROSS-REFERENCE TO RELATED APPLICATIONS

This application claims priority to and is the National Stage of International Application No. PCT/US2021/027499, filed on 15 Apr. 2021 and claims the priority to U.S. Provisional Application No. 63/011,505 filed on 17 Apr. 2020, the contents of each of which are incorporated by reference herein.

STATEMENT OF FEDERALLY FUNDED RESEARCH

None.

TECHNICAL FIELD OF THE INVENTION

The present invention relates to creating a broadband low loss insertion loss circuit comprising of a broadband inductor and shunt capacitor. The same circuit can also be used as a broadband filter.

BACKGROUND OF THE INVENTION

Without limiting the scope of the invention, its background is described in connection with traditional broadband inductors.

Broadband inductor is ideal for applications ranging from test instrumentation to microwave circuit design. Broadband inductor makes an excellent bias tee for use in communication platforms and RF micro-strips up to 100 GHz. One such tapered coil inductor is shown in FIG. 1, which shows a traditional broadband inductor of the prior art.

The broadband response of the tapered coil is directly related to precision of the winding and associated insulation stripping along with selective gold plating and powdered iron fill material. Broadband tapered conical inductors are available in SMT and flying lead versions along with various size, current handling and frequency ranges. Historically, it would take several narrow band inductors combined in series and or in parallel to address the broad frequency range of a single conical inductor. Conical inductors of this type are commercially available and made by, e.g., Piconics.

The commercially available conical inductors are produced in machinery that has precision tolerance of ±150 µm. The commercially available conical inductors have to better performance, low loss, improved reliability, reduced production times and a space saving on a printed circuit board compared to hand wound inductors. Inductors are an integral component in radiofrequency (RF) and microwave circuit design and are typically used as either impedance-matching elements or bias chokes. There are a wide variety of inductors designed to meet today's diverse applications. Using an inductor in a given application requires understanding its capabilities and limitations. One of the main limitations of an inductor is its self-resonance frequency or first parallel-resonance frequency (PRF), which affects the usable bandwidth.

SUMMARY OF THE INVENTION

In one embodiment, the present invention includes a method of producing a broadband inductor comprising: forming first trenches on a first side of a substrate of a conical inductor and filling the trenches with a conductive material; forming first and second vias through the substrate that connect to a first end and a second end, respectively, of each of the first trenches and filling the first and second vias with a conductive material; and forming second trenches on a second side of the substrate opposite the first side, and filling the second trenches with a conductive material, wherein each of the second trenches connects a first and second via is a conical shape, wherein the first and second trenches are the broadband inductor. In one aspect, the substrate is a photosensitive glass substrate and the step of forming trenches on the first or second side comprises: forming a photoresist with a trench pattern on the substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate trenches with an etchant; flood exposing the region outside of etched trenches of the photosensitive glass substrate to an activating energy source; heating the photosensitive glass substrate for at least ten minutes above its glass transition temperature; cooling the photosensitive glass/ceramic substrate to transform the exposed glass to a crystalline material to form a glass-crystalline substrate; selectively fill the trenches with a conductive material ground plane and input and output channels with one or more metals, wherein the metal is connected to a circuitry. In another aspect, the substrate is a photosensitive glass substrate and the step of forming vias from the first to the second side comprises: forming a photoresist with a via pattern on the substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate vias with an etchant; flood exposing the region outside of etched vias of the photosensitive glass substrate to an activating energy source; heating the photosensitive glass substrate for at least ten minutes above its glass transition temperature; cooling the photosensitive glass/ceramic substrate to transform the exposed glass to a crystalline material to form a glass-crystalline substrate; selectively filling the vias with a conductive material. In another aspect, the substrate is a photodefinable glass. In another aspect, the via and trench spacing is from 10 µm to 250 µm, preferably 50 µm. In another aspect, the via diameter is from 5 µm to 200 µm, preferably 25 µm. In another aspect, the via and trench height is from 25 µm to 1000 µm, preferably 300 µm. In another aspect, the broadband inductor comprises a high frequency and low frequency section. In another aspect, the broadband inductor is comprised of two semiconductor substrates. In another aspect, the broadband inductor consists of one semiconductor substrate. In another aspect, the broadband inductor is not rectangular. In another aspect, the broadband inductor comprises a cavity filled with a ferrite material. In another aspect, the broadband inductor further comprises one or more electrical components selected from resistors, connectors, or capacitors, that form a circuit. In another aspect, the broadband inductor is bonded to a circuit board.

In another embodiment, the present invention includes method of producing a broadband inductor comprising: forming first trenches on a first side of a photosensitive glass substrate of a conical inductor and filling the trenches with a conductive material, by: forming first and second vias through the photosensitive glass substrate that connect to a first end and a second end, respectively, of each of the first trenches and filling the first and second vias with a conductive material; and forming second trenches on a second side of the photosensitive glass substrate opposite the first side, and filling the second trenches with a conductive material, wherein each of the second trenches connects a first and second via is a conical shape, wherein the first and second trenches are the broadband inductor. In one aspect, the step of forming trenches on the first or second side comprises: forming a photoresist with a trench pattern on the substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate trenches with an etchant; flood exposing the region outside of etched trenches of the photosensitive glass substrate to an activating energy source; heating the photosensitive glass substrate for at least ten minutes above its glass transition temperature; cooling the photosensitive glass/ceramic substrate to transform the exposed glass to a crystalline material to form a glass-crystalline substrate; selectively fill the trenches with a conductive material ground plane and input and output channels with one or more metals, wherein the metal is connected to a circuitry. In another aspect, the step of forming vias from the first to the second side comprises: forming a photoresist with a via pattern on the substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate vias with an etchant; flood exposing the region outside of etched vias of the photosensitive glass substrate to an activating energy source; heating the photosensitive glass substrate for at least ten minutes above its glass transition temperature; cooling the photosensitive glass/ceramic substrate to transform the exposed glass to a crystalline material to form a glass-crystalline substrate; and selectively filling the vias with a conductive material. In another aspect, the via and trench spacing from 10 µm to 250 µm preferably 50 µm. In another aspect, the via diameter is from 5 µm to 200 µm, preferably 25 µm. In another aspect, the via, the trench, or both, have a height from 25 µm to 1000 µm, preferably 300 µm. In another aspect, the broadband inductor comprises a high frequency and low frequency section. In another aspect, the broadband inductor is comprised of two semiconductor substrates. In another aspect, the broadband inductor consists of one semiconductor substrate. In another aspect, the broadband inductor is not rectangular. In another aspect, the broadband inductor comprises a cavity filled with a ferrite material. In another aspect, the broadband inductor further comprises one or more electrical components selected from resistors, connectors, or capacitors, that form a circuit. In another aspect, the broadband inductor is bonded to a circuit board.

In another embodiment, the present invention includes broadband inductor comprising: first trenches on a first side of a substrate of a conical inductor and filling the trenches with a conductive material; first and second vias through the substrate that connect to a first end and a second end, respectively, of each of the first trenches and filling the first and second vias with a conductive material; and second trenches on a second side of the substrate opposite the first side, and filling the second trenches with a conductive material, wherein each of the second trenches connects a first and second via is a conical shape, wherein the first and second trenches are the broadband inductor. In one aspect, the substrate is a photosensitive glass substrate. In another aspect, the via and trench spacing is from 10 µm to 250 µm, preferably 50 µm. In another aspect, the via diameter is from 5 µm to 200 µm, preferably 25 µm. In another aspect, the via, the trench, or both, have a height from 25 µm to 1000 µm, preferably 300 µm. In another aspect, the broadband inductor comprises a high frequency and low frequency section. In another aspect, the broadband inductor is comprised of two semiconductor substrates. In another aspect, the broadband inductor consists of one semiconductor substrate. In another aspect, the broadband inductor is not rectangular. In another aspect, the broadband inductor comprises a cavity filled with a ferrite material. In another aspect, the broadband inductor further comprises one or more electrical components selected from resistors, connectors, or capacitors, that form a circuit.

BRIEF DESCRIPTION OF THE DRAWINGS

For a more complete understanding of the features and advantages of the present invention, reference is now made to the detailed description of the invention along with the accompanying figures and in which.

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

DETAILED DESCRIPTION OF THE INVENTION

While the making and using of various embodiments of the present invention are discussed in below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

The present invention includes high-performance inductors, and methods of making the same, that are used for broadband UHF to millimeter-wave choking or bias feed applications. Conical inductors are capable of extremely broadband, resonance-free inductance in the microhenry range that can be used for low-loss RF choking and bias feeding. The conical shape combined with careful assembly to low capacitance attach pads allows usable bandwidth of these inductors from 10 MHz to 40 GHz. The conical inductor overcomes the limited bandwidth seen in standard SMT inductors by virtue of its conical design and careful assembly.

Figure 2:
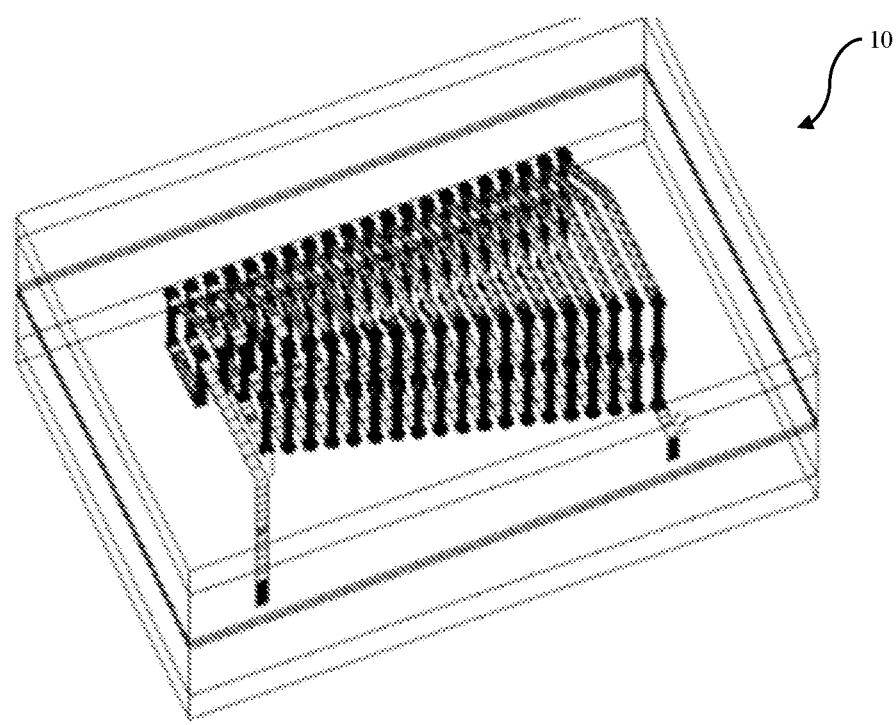
FIG. 2 shows a 3D rendering of a broadband inductor.

The novel design and method of manufacture of the broadband inductor of the present invention provides RF designers unparalleled advantages. Broadband filters are used in a wide-number parts in an RF circuit. FIG. 2 shows a 3D rendering of a completed, high precision tapered conical broadband inductor 10 of the present invention.

Figure 3:
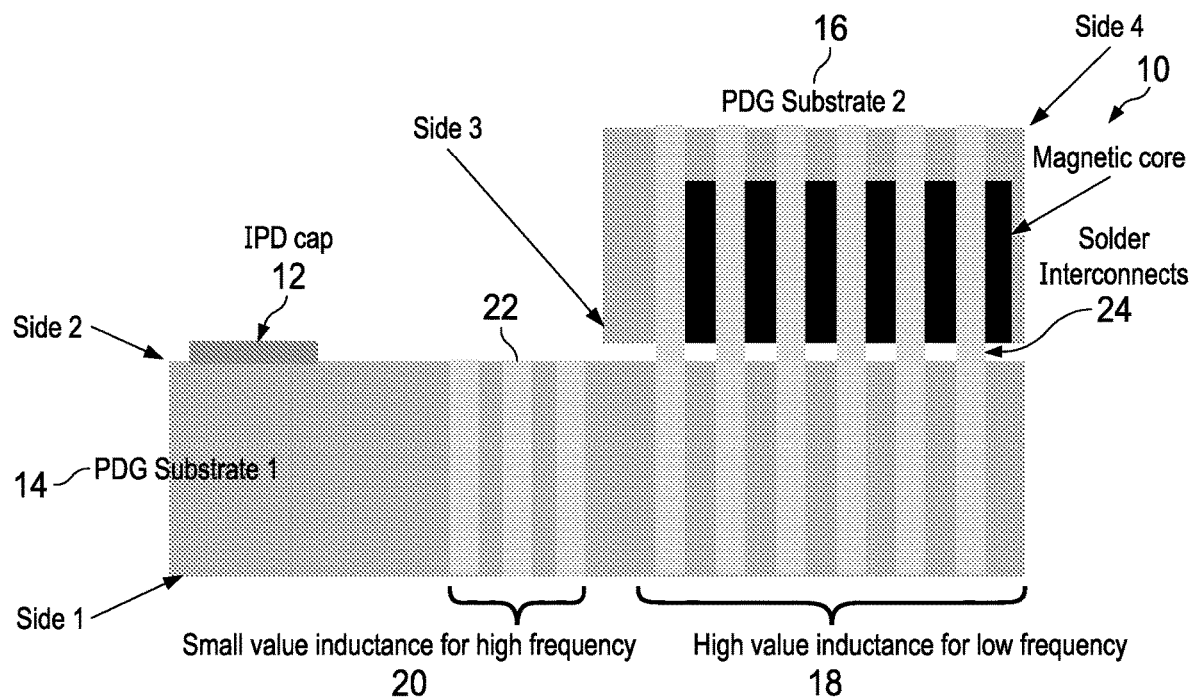
FIG. 3 shows a schematic of the broadband filter of the present invention.
Figure 4:
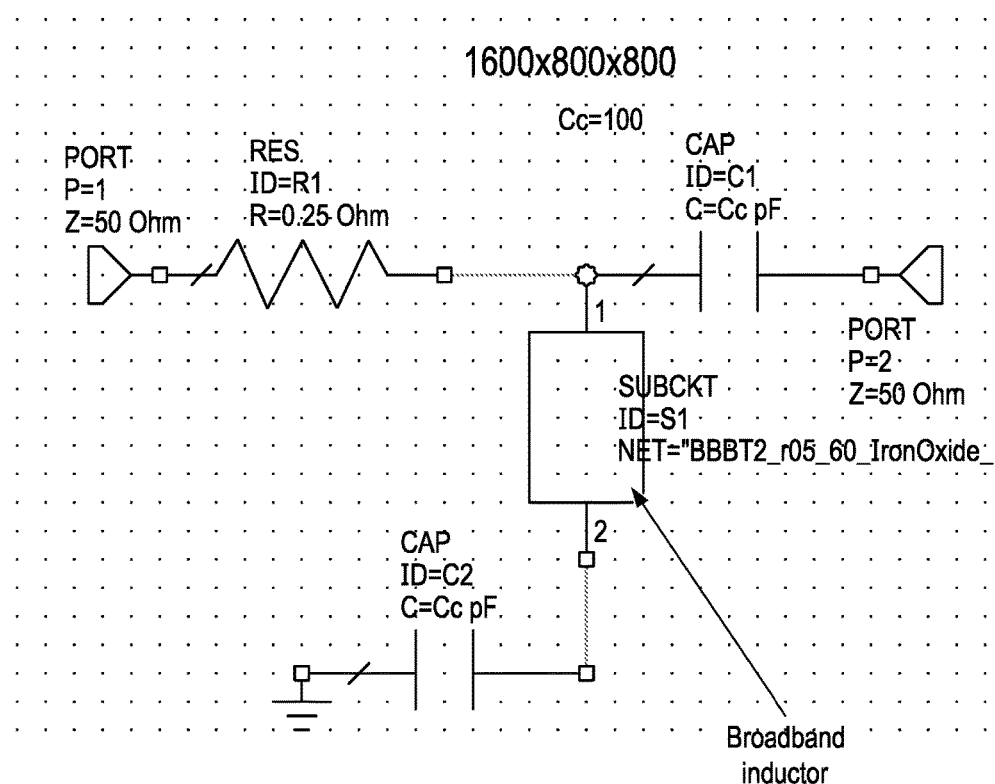
FIG. 4 shows an electrical circuit for a Broadband filter using a novel Broadband inductor.

FIG. 3 shows a cross section of the high precision tapered conical broadband inductor 10 and capacitor circuit 12 of the present invention. FIG. 3 shows a two-wafer implementation with a first substrate 14 and a second substrate 16 of the high precision tapered conical broadband inductor 10 of the present invention. The first part of the inductor starts, and is shown, on the right of the device and is the high value inductance for low frequency 18 of the inductor 10. A second part of the inductor starts, and is shown, on the left of the device and is the small value inductance for higher frequency 20 of the inductor 10. The high frequency inductor is on one wafer and is tapered from smaller (High Frequency Inductor) to wider (Lower Frequency Inductor). The broadband inductor's unique structure is created using a photodefinable glass processing method taught herein. FIG. 3 is further described in Table 1, below. FIG. 4 shows an electric circuit diagram of the broadband inductor of the present invention.

The present invention includes creating a broadband inductor that is made with integrated circuit precision and tolerance of ±0.5 μm in photo definable glass has significant performance enhancements, lower insertion loss, improved reliability, mass production, highest reliability and a space saving compared to the machine wound conical inductor. This is an enhancement in precision of over 30,000%. The mechanical precision enables the unexpected results shown in the graph of FIG. 5, in a side-by-side comparison with FIG. 6 (which shows the performance of a prior art conical inductor, such as the one shown in FIG. 1).

The photodefinable processing substrate, here in generally by: exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate (trench(s) and via(s)) with an etchant; flood exposing the region outside of etched trenches and vias of the photosensitive glass substrate to an activating energy source; heating the photosensitive glass substrate for at least ten minutes above its glass transition temperature; cooling the photosensitive glass/ceramic substrate to transform the exposed glass to a crystalline material to form a glass-crystalline substrate; selectively fill the (trench(s) and via(s)) with a conductive material ground plane and input and output channels with one or more metals, wherein the metal is connected to a circuitry; and etch the ceramitized perimeter of the photodefinable glass to expose the filled trenches.

In one aspect, the photosensitive glass substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; and the combination of $B_2O_3$; and $Al_2O_3$ not exceeding 13 weight %; 8-15 weight % $Li_2O$; and 0.001-0.1 weight % $CeO_2$. In another aspect, the photosensitive glass substrate is a glass substrate comprising a composition of: 35-76 weight % silica, 3-16 weight % $K_2O$, 0.003-1 weight % $Ag_2O$, 8-15 weight % $Li_2O$, and 0.001-0.1 weight % $CeO_2$. In another aspect, the photosensitive glass substrate is at least one of: a photo-definable glass substrate comprises at least 0.1 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO, SrO and BaO; and optionally has an anisotropic-etch ratio of exposed portion to said unexposed portion is at least one of 10-20:1; 21-29:1; 30-45:1; 20-40:1; 41-45:1; and 30-50:1. In another aspect, the photosensitive glass substrate is a photosensitive glass ceramic composite substrate comprising at least one of silica, lithium oxide, aluminum oxide, or cerium oxide. In another aspect, the electronic circuit. In another aspect, the method further comprises forming the mechanically and thermally stabilized transmission line structure into a feature of at least one or more passive and active components to form bandpass, low pass, high pass, shunt or notch filter and other circuits.

Microstructures have been produced relatively inexpensively with these glasses using conventional semiconductor processing equipment. In general, glasses have high temperature stability, good mechanical a n d electrically properties, and have better chemical resistance than plastics and many metals. Photoetchable glass is comprised of lithium-aluminum-silicate glass containing traces of silver ions. When exposed to UV-light within the absorption band of cerium oxide, the cerium oxide acts as sensitizers, absorbing a photon and losing an electron that reduces neighboring silver oxide to form silver atoms, e.g.,

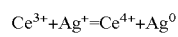

$$Ce^{3+}+Ag^+=Ce^{4+}+Ag^0$$

The silver atoms coalesce into silver nanoclusters during the baking process and induce nucleation sites for crystallization of the surrounding glass. If exposed to UV light through a mask, only the exposed regions of the glass will crystallize during subsequent heat treatment.

This heat treatment must be performed at a temperature near the glass transformation temperature (e.g. Greater than 465° C. in air). The crystalline phase is more soluble in etchants, such as hydrofluoric acid (HF), than the unexposed vitreous, amorphous regions. The crystalline regions etched greater than 20 times faster than the amorphous regions in 10% HF, enabling microstructures with wall slopes ratios of about 20:1 when the exposed regions are removed. See T. R. Dietrich, et al., "Fabrication Technologies for Microsystems utilizing Photoetchable Glass", Microelectronic Engineering 30,497 (1996), relevant portions of which are incorporated herein by reference.

The exposed portion may be transformed into a crystalline material by heating the glass substrate to a temperature near the glass transformation temperature. When etching the glass substrate in an etchant such as hydrofluoric (HF) acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that have an aspect ratio of at least 30:1, and to provide a lens shaped glass structure. The exposed glass is then baked typically in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, where in the etch ratio of exposed portion to that of the unexposed portion is at least 30:1. Creating etched features that will be filled with metals, dielectrics, and/or resistive elements combined with active devices to from circuits. The final processing steps prior to the creation of the electric circuits and structures in photoetchable glass structure is to fully convert the remaining glass substrate to a ceramic phase. The ceramicization of the glass is accomplished by exposing all of the remaining photodefinable glass substrate to approximately 20 J/cm$^2$ of 310 nm light. Then heat the substrate to a temperature to between 420° C.-520° C. for up to 2 hours, for the coalescing of silver ions into silver nanoparticles and temperature range heated between 520° C.-620° C. for between 10 minutes and 2 hours allowing the lithium oxide to form around the silver nanoparticles. The substrate is then cooled and then processed to metalized structures (interconnects, via and others). Finally, the active and passive devices are placed on to the ceramitized substrate.

TABLE 1

| | Two wafer Broadband Inductor (BBI) (shown in FIG. 3) is created by: |
|---|---|
| Step 1 | The Side 1 of the photodefinable glass (PDG) substrate 14 is coated with photoresist where a via (circular) pattern is then created using standard photolithography processes. The circular via pattern is aligned end of the copper pattern 22 on Side 1. Where the via spacing can range from 10 μm to 250 μm (e.g. 50 μm) center to center spacing with a diameter ranging from 5 μm to 200 μm (e.g. 25 μm) and a via depth from 25 μm to 1000 μm (e.g. 300 μm) |
| Step 2 | The circular via pattern (See FIG. 2) is then exposed with at least 2 J/cm$^2$ of 310 nm light. The photoresist is then removed with a standard stripper. |
| Step 3 | The PDG substrate is then baked to 600° C. for at least 10 min to convert the UV exposed section to a ceramic phase. |
| Step 4 | The ceramic phase is then removed down to the copper plated region on Side 1, using a chemical etch with 10% HF solution. |
| Step 5 | PDG Substrate 1 is then placed into an electroplating bath where the vias are filled with copper. |
| Step 6 | Depositing a titanium adhesion layer on surface of Side 1 of the photodefinable glass (PDG) Substrate 1 (FIG. 3 substrate 14) followed by a thin layer of copper (Cu). |
| Step 7 | The titanium (Ti) can be deposited by a number of different techniques including but not limited to sputtering, e-beam evaporation PLD and or CVD. The thickness of the Ti layer can range from 5 nm to 200 nm, e.g., 100 nm. The thickness of the Cu layer can range from 200 nm to 1,000 nm, e.g. 500 nm. |
| Step 8 | The thin film of Ti and Cu can be patterned etched using a standard photoresist coating, exposure and developer or an Argon ion mill processes. |
| Step 9 | The photoresist is then removed using a tradition photoresist stripper. The PDG Substrate 1 (FIG. 3 substrate 14) is then placed into electroplating system where copper is plated on to the Ti/Cu layer. |
| Step 10 | A solder ball 24 is then applied to each of the copper filled via. The solder balls are placed on Side 2 of Substrate 1 (FIG. 3 substrate 14) on the low frequency part 18 of the broadband inductor. The solder acts as an electrical, a mechanical, or both an electrical and mechanical connection, between PDG Substrate 1 (FIG. 3 substrate 14) and 2 (FIG. 3 substrate 16). Alternatively, the solder balls 24 can be applied to Side 3 of Substrate 2 (FIG. 3 substrate 16). |
| Step 11 | The Side 3 of the PDG Substrate 2 (FIG. 3 substrate 16) is coated with photoresist where a via (circular) pattern is then created using standard photolithography processes. |
| Step 12 | The circular via pattern is then exposed with at least 2 J/cm$^2$ of 310 nm light for at least 10 min. The photoresist is then removed with a standard stripper. |
| Step 13 | The Side 3 of the PDG Substrate 2 (FIG. 3 substrate 16) is then coated with photoresist where a rectangular pattern is then created using standard photolithography processes. |
| Step 14 | The rectangular pattern is then exposed with at least 2 J/cm$^2$ of 310 nm light for at least 8 min. The photoresist is then removed with a standard stripper. |
| Step 15 | The PDG Substrate 2 (FIG. 3 substrate 16) is then baked to 600° C. for at least 10 min to convert the UV exposed section to a ceramic phase. |
| Step 16 | The ceramic phase of the vias is then selectively removed down to the copper plated region on Side 4, using a chemical etch with 10% HF solution. |
| Step 17 | PDG Substrate 2 (FIG. 3 substrate 16) is then place into an electroplating bath where the vias are filled with copper. |

TABLE 1-continued

Two wafer Broadband Inductor (BBI) (shown in FIG. 3) is created by:

| Step | Description |
|---|---|
| Step 18 | The ceramic phase of the rectangle is then selectively removed 25 um to 500 um, e.g., 300 um, forming a cavity, using a chemical etch with 10% HF solution. |
| Step 19 | The rectangular open is then filled with a commercially available ferrite paste using a silk-screening technique and annealed as prescribed by the manufacturer. |
| Step 20 | The titanium (Ti) and copper (Cu) can be deposited on PDG Substrate 2 Side 4 (FIG. 3 substrate 16), by a number of different techniques including but not limited to sputtering, e-beam evaporation PLD and or CVD. The thickness of the Ti layer can range from 5 nm to 200 nm e.g., 100 nm. The thickness of the Cu layer can range from 200 nm to 1,000 nm, e.g., 500 nm. |
| Step 21 | The thin film of Ti/Cu is patterned etched using a standard photoresist coating, exposure and developer process and then Argon ion mill to create a patterned adhesion layer for copper plating. The photoresist is then removed using a tradition photoresist stripper. |
| Step 22 | The PDG Substrate 2 (FIG. 3 substrate 16) is then placed into electroplating system where copper is plated on to the Ti/Cu adhesion layer. |
| Step 23 | PDG Substrate 2 (FIG. 3 substrate 16) is then diced into individual die |
| Step 24 | The die are then added on to PDG Substrate 1's (FIG. 3 substrate 16) solder bumps 24 and the solder is reflowed, bonding Substrate 1 (FIG. 3 substrate 14) and 2 together (FIG. 3 substrate 16). |
| Step 25 | To complete a circuit an Capacitor, 12 such as an integrated passive device (IPD) capacitor is also added on to the PDG Substrate 1 (FIG. 3 substrate 14). |

Figure 7:
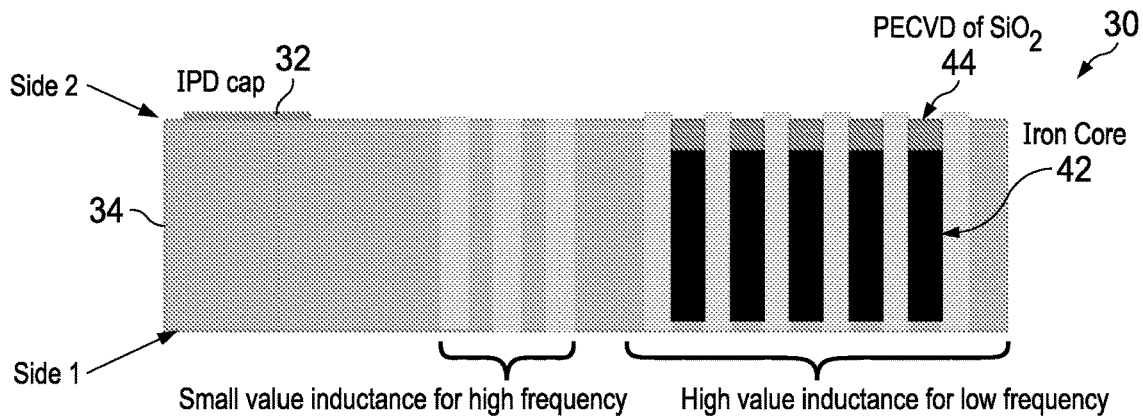
FIG. 7. Shows a single wafer implantation of a BBI.

FIG. 7 shows a single wafer Broadband Inductor 30 that includes a capacitor 32 on substrate 34, which is a PGD substrate. The first part of the inductor starts, and is shown, on the right of the device and is the high value inductance for low frequency 38 of the inductor 30. A second part of the inductor starts, and is shown, on the left of the device and is the small value inductance for higher frequency 40 of the inductor 10. An iron core 42 is disposed within the high value inductance for low frequency 38 of the inductor 30, in other words, the antenna surrounds and does not contact the iron core 42. A passivation layer 44 is disposed on the iron core and separates the coils of the small value inductance for higher frequency 40, which passivation layer 44 can be, e.g., a SiO$_2$ layer that can be formed or deposited by plasma enhanced chemical vapor deposition (PECVD).

TABLE 2

The Single wafer Broadband Inductor (BBI) of FIG. 7 is created by:

| Step | Description |
|---|---|
| Step 1 | The Side 1 of the PDG Substrate 1 (FIG. 7, substrate 34) is coated with photoresist where a via (circular) pattern is then created using standard photolithography processes. The circular via pattern is aligned end of the copper pattern on Side 1. Where the via spacing can range from 10 μm to 250 μm (e.g. 50 μm) center to center spacing with a diameter ranging from 5 μm to 200 μm (e.g. 25 μm) and a via depth from 25 μm to 1000 μm (e.g. 300 μm) |
| Step 2 | The circular via pattern is then exposed with at least 2 J/cm$^2$ of 310 nm light for at least 10 min. The photoresist is then removed with a standard stripper. |
| Step 3 | The Side 2 of the PDG Substrate 1 (FIG. 7, substrate 34) is then coated with photoresist where a rectangular pattern is then created using standard photolithography processes. |
| Step 4 | The rectangular pattern is then exposed with at least 2 J/cm$^2$ of 310 nm light for at least 8 min. The photoresist is then removed with a standard stripper. |
| Step 5 | The PDG Substrate 1 (FIG. 7, substrate 34) is then baked to 600° C. for at least 10 min to convert the UV exposed section to a ceramic phase. |
| Step 6 | The ceramic phase of the vias and rectangular cavity for the ferrite material is then selectively removed down to the copper plated region on Side 2, using a chemical etch with 10% HF solution. |
| Step 7 | PDG Substrate 1 (FIG. 7, substrate 34) is then place into an electroplating bath where the vias are filled with copper. |
| Step 8 | The ceramic phase of the rectangle is then selectively removed 25 um to 500 um, preferably 300 um, forming a cavity, using a chemical etch with 10% HF solution. |
| Step 9 | The rectangular open is then filled with a commercially available ferrite paste using a silk-screening technique and annealed as prescribed by the manufacturer. |
| Step 10 | The titanium (Ti) and copper (Cu) can be deposited on PDG Substrate 1 (FIG. 7, substrate 34) Side 1, by a number of different |

TABLE 2-continued

The Single wafer Broadband Inductor (BBI) of FIG. 7 is created by:

| | |
|---|---|
| | techniques including but not limited to sputtering, e-beam evaporation PLD and or CVD. The thickness of the Ti layer can range from 5 nm to 200 nm preferably 100 nm. The thickness of the Cu layer can range from 200 nm to 1,000 nm, e.g. 500 nm. |
| Step 11 | The thin film of Ti/Cu is patterned etched using a standard photoresist coating, exposure and developer process and then Argon ion mill to create a patterned adhesion layer for copper plating. The photoresist is then removed using a tradition photoresist stripper. |
| Step 12 | The PDG Substrate 1 (FIG. 7, substrate 34) is then placed into electroplating system where copper is plated on to the Ti/Cu adhesion layer. |
| Step 13 | The PDG Substrate 1 (FIG. 7, substrate 34) is coated with a passivation layer 44 (e.g., $SiO_2$) using a PECVD system or other system. |
| Step 14 | On PDG Substrate 1 (FIG. 7, substrate 34) Side 2, the $SiO_2$ is CMP lapped and polished flat |
| Step 15 | On PDG Substrate 1 (FIG. 7, substrate 34) Side 2, a photoresist is applied, exposed and developed to expose the via pattern |
| Step 16 | The $SiO_2$ via pattern is then plasma etcher down to the copper filled via to clear a path t complete the inductor structure. |
| Step 17 | The titanium (Ti) and copper (Cu) can be deposited on PDG Substrate 1 (FIG. 7, substrate 34) Side 2, by a number of different techniques including but not limited to sputtering, e-beam evaporation PLD and or CVD. The thickness of the Ti layer can range from 5 nm to 200 nm preferably 100 nm. The thickness of the Cu layer can range from 200 nm to 1,000 nm, e.g. 500 nm. |
| Step 18 | The thin film of Ti/Cu is patterned etched using a standard photoresist coating, exposure and developer process and then Argon ion mill to create a patterned adhesion layer for copper plating. The photoresist is then removed using a tradition photoresist stripper. |
| Step 19 | The PDG Substrate 1 (FIG. 7, substrate 34) is then placed into electroplating system where copper is plated on to the Ti/Cu adhesion layer. |
| Step 20 | To complete a circuit an IPD Capacitor is added on to the PDG Substrate 1 substrate (FIG. 7, substrate 34). |
| Step 21 | PDG Substrate 1 (FIG. 7, substrate 34) is then diced into individual die |

The Insertion loss of the BBI is no more than 0.01 dB at 50 MHz to 0.25 dB at 40 GHz. Where the commercially available BBI has an insertion loss of 0.25 dB insertion loss at 40 MHz to 1.75 dB at 40 GHz. This performance enhancement when combined with the size reduction and integrated circuit-based manufacturing process provides dramatic commercial advantage.

Figure 1:
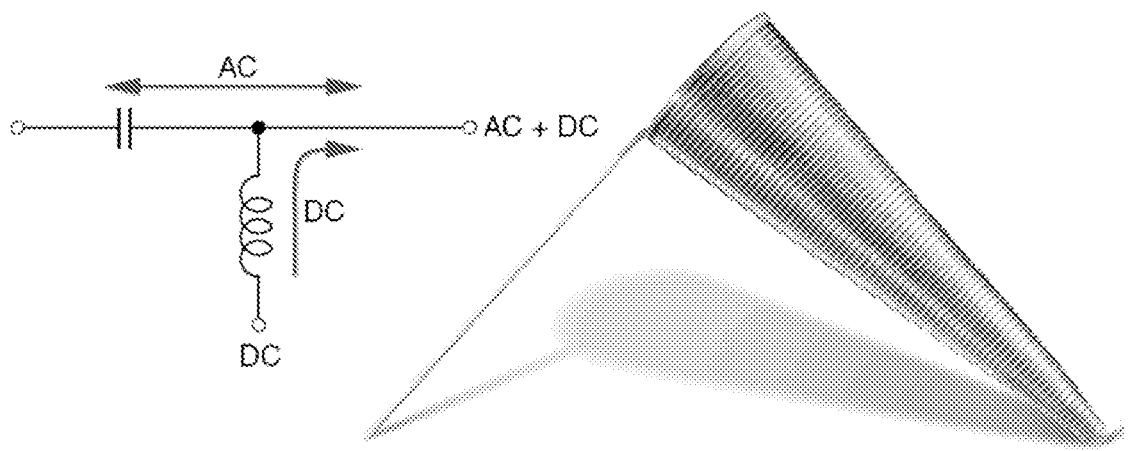
FIG. 1 shows a traditional broadband inductor of the prior art.
Figure 5:
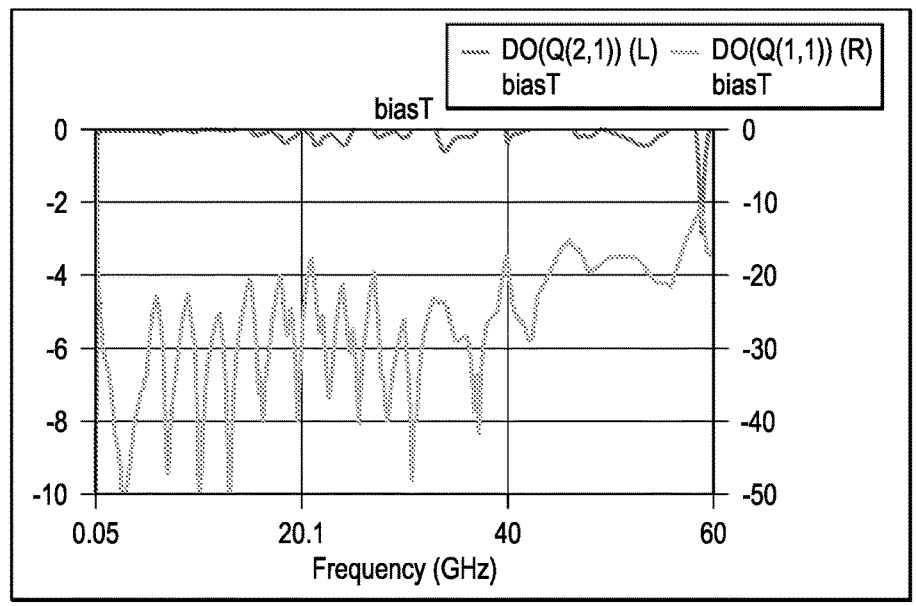
FIG. 5 shows a simulation of the electrical circuit for a Broadband filter using a novel Broadband inductor.
Figure 6:
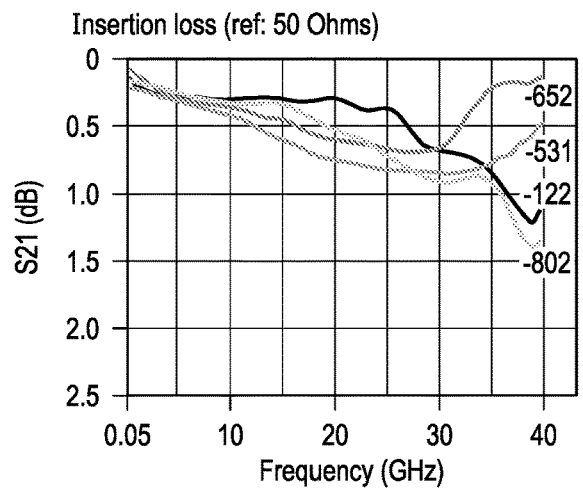
FIG. 6 shows the insertion loss of a broadband inductor made by Coilcraft in a biasT circuit.

The mechanical precision enables the unexpected results shown in the graph of FIG. 5, in a side-by-side comparison with FIG. 6 (which shows the performance of a prior art conical inductor, such as the one shown in FIG. 1). FIG. 6 is a graph that shows the insertion loss of a broadband inductor made by Coilcraft in a biasT circuit. FIG. 7 shows a single wafer implementation of the BBI of the present invention.

Thus, the present invention includes a method of producing a broadband inductor comprising, consisting essentially of, or consisting of: forming first trenches on a first side of a substrate of a conical inductor and filling the trenches with a conductive material; forming first and second vias through the substrate that connect to a first end and a second end, respectively, of each of the first trenches and filling the first and second vias with a conductive material; and forming second trenches on a second side of the substrate opposite the first side, and filling the second trenches with a conductive material, wherein each of the second trenches connects a first and second via is a conical shape, wherein the first and second trenches are the broadband inductor. In one aspect, the substrate is a photosensitive glass substrate and the step of forming trenches on the first or second side comprises: forming a photoresist with a trench pattern on the substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate trenches with an etchant; flood exposing the region outside of etched trenches of the photosensitive glass substrate to an activating energy source; heating the photosensitive glass substrate for at least ten minutes above its glass transition temperature; cooling the photosensitive glass/ceramic substrate to transform the exposed glass to a crystalline material to form a glass-crystalline substrate; selectively fill the trenches with a conductive material ground plane and input and output channels with one or more metals, wherein the metal is connected to a circuitry. In another aspect, the substrate is a photosensitive glass substrate and the step of forming vias from the first to the second side comprises: forming a photoresist with a via pattern on the substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate vias with an etchant; flood exposing the region outside of etched vias of the photosensitive glass substrate to an activating energy source; heating the photosensitive glass substrate for at least ten minutes above its glass transition temperature; cooling the photosensitive glass/ceramic substrate to transform the exposed glass to a crystalline material to form a glass-crystalline substrate; selectively filling the vias with a conductive material. In another aspect, the substrate is a photodefinable glass. In another aspect, the via and trench spacing is from 10 µm to 250 µm, preferably 20, 30, 40, 50, 60, 70, 80, 90, 100, 125, 150, 175, 200, or 225 µm. In another aspect, the via diameter is from 5 µm to 200 µm, preferably 10, 15, 20, 25, 30, 40, 50, 75, 100, 125, 150, or 175 µm. In another aspect, the via and trench height is from 25 µm to 1000 µm, preferably 100, 200, 250, 300, 350, 400, 500, 600, 700, 750, 800, or 900 µm. In another aspect, the broadband inductor comprises a high frequency and low frequency section. In another aspect, the broadband inductor is comprised of two semiconductor substrates. In another aspect, the broadband inductor consists of one semiconductor substrate. In another aspect, the broadband inductor is not rectangular. In another aspect, the broadband inductor comprises a cavity filled with a ferrite material. In another aspect, the broadband inductor further comprises one or more electrical components selected from resistors, connectors, or capacitors, that form a circuit. In another aspect, the broadband inductor is bonded to a circuit board.

The present invention also includes method of producing a broadband inductor comprising, consisting essentially of, or consisting of: forming first trenches on a first side of a photosensitive glass substrate of a conical inductor and filling the trenches with a conductive material, by: forming first and second vias through the photosensitive glass substrate that connect to a first end and a second end, respectively, of each of the first trenches and filling the first and second vias with a conductive material; and forming second trenches on a second side of the photosensitive glass substrate opposite the first side, and filling the second trenches with a conductive material, wherein each of the second trenches connects a first and second via is a conical shape, wherein the first and second trenches are the broadband inductor. In one aspect, the step of forming trenches on the first or second side comprises: forming a photoresist with a trench pattern on the substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate trenches with an etchant; flood exposing the region outside of etched trenches of the photosensitive glass substrate to an activating energy source; heating the photosensitive glass substrate for at least ten minutes above its glass transition temperature; cooling the photosensitive glass/ceramic substrate to transform the exposed glass to a crystalline material to form a glass-crystalline substrate; selectively fill the trenches with a conductive material ground plane and input and output channels with one or more metals, wherein the metal is connected to a circuitry. In another aspect, the step of forming vias from the first to the second side comprises: forming a photoresist with a via pattern on the substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate vias with an etchant; flood exposing the region outside of etched vias of the photosensitive glass substrate to an activating energy source; heating the photosensitive glass substrate for at least ten minutes above its glass transition temperature; cooling the photosensitive glass/ceramic substrate to transform the exposed glass to a crystalline material to form a glass-crystalline substrate; and selectively filling the vias with a conductive material. In another aspect, the via and trench spacing is from 10 µm to 250 µm, preferably 20, 30, 40, 50, 60, 70, 80, 90, 100, 125, 150, 175, 200, or 225 µm. In another aspect, the via diameter is from 5 µm to 200 µm, preferably 10, 15, 20, 25, 30, 40, 50, 75, 100, 125, 150, or 175 µm. In another aspect, the via and trench height is from 25 µm to 1000 µm, preferably 100, 200, 250, 300, 350, 400, 500, 600, 700, 750, 800, or 900 µm. In another aspect, the broadband inductor comprises a high frequency and low frequency section. In another aspect, the broadband inductor is comprised of two semiconductor substrates. In another aspect, the broadband inductor consists of one semiconductor substrate. In another aspect, the broadband inductor is not rectangular. In another aspect, the broadband inductor comprises a cavity filled with a ferrite material. In another aspect, the broadband inductor further comprises one or more electrical components selected from resistors, connectors, or capacitors, that form a circuit. In another aspect, the broadband inductor is bonded to a circuit board.

The present invention includes a broadband inductor comprising, consisting essentially of, or consisting of: first trenches on a first side of a substrate of a conical inductor and filling the trenches with a conductive material; first and second vias through the substrate that connect to a first end and a second end, respectively, of each of the first trenches and filling the first and second vias with a conductive material; and second trenches on a second side of the substrate opposite the first side, and filling the second trenches with a conductive material, wherein each of the second trenches connects a first and second via is a conical shape, wherein the first and second trenches are the broadband inductor. In one aspect, the substrate is a photosensitive glass substrate. In another aspect, the via and trench spacing is from 10 µm to 250 µm, preferably 20, 30, 40, 50, 60, 70, 80, 90, 100, 125, 150, 175, 200, or 225 µm. In another aspect, the via diameter is from 5 µm to 200 µm, preferably 10, 15, 20, 25, 30, 40, 50, 75, 100, 125, 150, or 175 µm. In another aspect, the via and trench height is from 25 µm to 1000 µm, preferably 100, 200, 250, 300, 350, 400, 500, 600, 700, 750, 800, or 900 µm. In another aspect, the broadband inductor comprises a high frequency and low frequency section. In another aspect, the broadband inductor is comprised of two semiconductor substrates. In another aspect, the broadband inductor consists of one semiconductor substrate. In another aspect, the broadband inductor is not rectangular. In another aspect, the broadband inductor comprises a cavity filled with a ferrite material. In another aspect, the broadband inductor further comprises one or more electrical components selected from resistors, connectors, or capacitors, that form a circuit.

It will be understood that particular embodiments described herein are shown by way of illustration and not as limitations of the invention. The principal features of this invention can be employed in various embodiments without departing from the scope of the invention. Those skilled in the art will recognize or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

To aid the Patent Office, and any readers of any patent issued on this application in interpreting the claims appended hereto, applicants wish to note that they do not intend any of the appended claims to invoke paragraph 6 of 35 U.S.C. § 112, U.S.C. § 112 paragraph (f), or equivalent, as it exists on the date of filing hereof unless the words "means for" or "step for" are explicitly used in the particular claim.

For each of the claims, each dependent claim can depend both from the independent claim and from each of the prior dependent claims for each and every claim so long as the prior claim provides a proper antecedent basis for a claim term or element.

What is claimed is:

1. A method of producing a broadband inductor comprising:
    forming first trenches on a first side of a substrate of a conical inductor and filling the first trenches with a conductive material;
    forming first and second vias through the substrate that connect to a first end and a second end, respectively, of each of the first trenches and filling the first and second vias with a conductive material; and
    forming second trenches on a second side of the substrate opposite the first side, and filling the second trenches with a conductive material, wherein each of the second trenches connects the first and second vias in a conical shape, and wherein the first and second trenches are the broadband inductor.

2. The method of claim 1, wherein the substrate is a photosensitive glass substrate and the step of forming the first trenches and the step of forming the second trenches each comprises:
    forming a photoresist with a trench pattern on the substrate;
    exposing at least one portion of the photosensitive glass substrate to an activating energy source;
    heating the photosensitive glass substrate a first time for at least ten minutes above a glass transition temperature thereof;
    cooling the photosensitive glass substrate a first time to transform at least part of the exposed glass substrate to a crystalline material to form a glass-crystalline substrate;
    etching the first or second trenches in the glass-crystalline substrate with an etchant;
    flood exposing a region outside of the etched first or second trenches of the photosensitive glass substrate to the activating energy source;
    heating the photosensitive glass substrate a second time for at least ten minutes above the glass transition temperature thereof;

cooling the photosensitive glass substrate a second time to transform the exposed glass substrate to a crystalline material to form a glass-crystalline substrate; and selectively filling the first and second trenches with a conductive material ground plane and input and output channels with one or more metals, wherein the one or more metals are connected to a circuitry.

3. The method of claim 1, wherein the substrate is a photosensitive glass substrate and the step of forming the first vias and the step of forming the second vias from the first to the second side each comprises:

forming a photoresist with a via pattern on the substrate;

exposing at least one portion of the photosensitive glass substrate to an activating energy source;

heating the photosensitive glass substrate a first time for at least ten minutes above a glass transition temperature thereof;

cooling the photosensitive glass substrate a first time to transform at least part of the exposed glass to a crystalline material to form a glass-crystalline substrate;

etching the first or second vias in the glass-crystalline substrate with an etchant;

flood exposing a region outside of the etched first or second vias of the photosensitive glass substrate to the activating energy source;

heating the photosensitive glass substrate a second time for at least ten minutes above the glass transition temperature thereof;

cooling the photosensitive glass/ceramic substrate a second time to transform the exposed glass to a crystalline material to form a glass-crystalline substrate; and selectively filling the first and second vias with a conductive material.

4. The method of claim 1, wherein the substrate is a photosensitive glass.

5. The method of claim 1, wherein via and trench spacing is from 10 μm to 250 μm.

6. The method of claim 1, wherein a via diameter is from 5 μm to 200 μm.

7. The method of claim 1, wherein a via height or a trench height is from 25 μm to 1000 μm.

8. The method of claim 1, wherein the broadband inductor comprises a high frequency and low frequency section.

9. The method of claim 1, wherein the broadband inductor comprises two semiconductor substrates.

10. The method of claim 1, wherein the broadband inductor comprises one semiconductor substrate.

11. The method of claim 1, wherein the broadband inductor is not rectangular.

12. The method of claim 1, wherein the broadband inductor comprises a cavity filled with a ferrite material.

13. The method of claim 1, wherein the broadband inductor further comprises one or more electrical components selected from resistors, connectors, or capacitors, that form a circuit.

14. The method of claim 1, wherein the broadband inductor is bonded to a circuit board.

15. A method of producing a broadband inductor comprising:

forming first trenches on a first side of a photosensitive glass substrate of a conical inductor and filling the first trenches with a conductive material, by:

forming first and second vias through the photosensitive glass substrate that connect to a first end and a second end, respectively, of each of the first trenches and filling the first and second vias with a conductive material; and forming second trenches on a second side of the photosensitive glass substrate opposite the first side, and filling the second trenches with a conductive material, wherein each of the second trenches connects the first and second vias in a conical shape, and wherein the first and second trenches are the broadband inductor.

16. The method of claim 15, wherein the of forming the first trenches and the step of forming the second trenches each comprises:

forming a photoresist with a trench pattern on the substrate;

exposing at least one portion of the photosensitive glass substrate to an activating energy source;

heating the photosensitive glass substrate a first time for at least ten minutes above a glass transition temperature thereof;

cooling the photosensitive glass substrate a first time to transform at least part of the exposed glass substrate to a crystalline material to form a glass-crystalline substrate;

etching the first or second trenches in the glass crystalline substrate with an etchant;

flood exposing a region outside of the etched first or second trenches of the photosensitive glass substrate to the activating energy source;

heating the photosensitive glass substrate a second time for at least ten minutes above the glass transition temperature thereof;

cooling the photosensitive glass substrate a second time to transform the exposed glass substrate to a crystalline material to form a glass-crystalline substrate; and selectively filling the trenches with a conductive material ground plane and input and output channels with one or more metals, wherein the one or more metals are connected to a circuitry.

17. The method of claim 15, wherein the step of forming the first vias and the step of forming the second vias from the first to the second side each comprises:

forming a photoresist with a via pattern on the substrate;

exposing at least one portion of the photosensitive glass substrate to an activating energy source;

heating the photosensitive glass substrate a first time for at least ten minutes above a glass transition temperature thereof;

cooling the photosensitive glass substrate a first time to transform at least part of the exposed glass to a crystalline material to form a glass-crystalline substrate;

etching the first or second vias, respectively, with an etchant;

flood exposing a region outside of the etched first or second vias respectively, of the photosensitive glass substrate to the activating energy source;

heating the photosensitive glass substrate a second time for at least ten minutes above the glass transition temperature thereof;

cooling the photosensitive glass substrate a second time to transform the exposed glass to a crystalline material to form a glass-crystalline substrate; and selectively filling the first and second vias with a conductive material.

18. The method of claim 15, wherein via and trench spacing is from 10 μm to 250 μm.

19. The method of claim 15, wherein a via diameter is from 5 μm to 200 μm.

20. The method of claim 15, wherein a via height or a trench height is from 25 μm to 1000 μm.

21. The method of claim 15, wherein the broadband inductor comprises a high frequency and low frequency section.

22. The method of claim 15, wherein the broadband inductor comprises two semiconductor substrates.

23. The method of claim 15, wherein the broadband inductor comprises one semiconductor substrate.

24. The method of claim 15, wherein the broadband inductor is not rectangular.

25. The method of claim 15, wherein the broadband inductor comprises a cavity filled with a ferrite material.

26. The method of claim 15, wherein the broadband inductor further comprises one or more electrical components selected from resistors, connectors, or capacitors, that form a circuit.

27. The method of claim 15, wherein the broadband inductor is bonded to a circuit board.

* * * * *